United States Patent
Li et al.

(10) Patent No.: US 12,061,371 B2
(45) Date of Patent: Aug. 13, 2024

(54) PATCH ON INTERPOSER ARCHITECTURE FOR LOW COST OPTICAL CO-PACKAGING

(71) Applicant: Intel Corporation, Santa Clara, CA (US)

(72) Inventors: Xiaoqian Li, Chandler, AZ (US); Nitin Deshpande, Chandler, AZ (US); Omkar Karhade, Chandler, AZ (US); Ravindranath V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 706 days.

(21) Appl. No.: 17/131,621

(22) Filed: Dec. 22, 2020

(65) Prior Publication Data

US 2022/0196943 A1 Jun. 23, 2022

(51) Int. Cl.
*G02B 6/42* (2006.01)
*H01L 23/00* (2006.01)
*H01L 23/367* (2006.01)
*H01L 25/16* (2023.01)

(52) U.S. Cl.
CPC .......... *G02B 6/4292* (2013.01); *G02B 6/423* (2013.01); *G02B 6/4243* (2013.01); *G02B 6/4268* (2013.01); *H01L 23/3675* (2013.01); *H01L 24/16* (2013.01); *H01L 25/167* (2013.01); *H01L 2224/16145* (2013.01)

(58) Field of Classification Search
CPC .... G02B 6/4292; G02B 6/423; G02B 6/4243; G02B 6/4268; G02B 6/421; G02B 6/4249; H01L 23/3675; H01L 23/3677; H01L 24/16; H01L 25/167; H01L 2224/1614; H01L 2224/16225; H01L 2224/32225; H01L 2224/73204; H01L 2224/73253

See application file for complete search history.

(56) References Cited

U.S. PATENT DOCUMENTS

| | | | | |
|---|---|---|---|---|
| 9,921,379 | B2 * | 3/2018 | Ding | H05K 1/181 |
| 10,090,286 | B2 * | 10/2018 | Budd | G02B 6/4274 |
| 10,348,437 | B2 * | 7/2019 | Welch | G02B 6/428 |
| 10,924,269 | B1 * | 2/2021 | Ding | H05K 1/0274 |

(Continued)

OTHER PUBLICATIONS

International Search Report and Written Opinion for International Patent Application No. PCT/US2021/050895, mailed Jan. 5, 2022, 9 pgs.

(Continued)

*Primary Examiner* — Andrew Jordan
(74) *Attorney, Agent, or Firm* — Schwabe, Williamson & Wyatt, P.C.

(57) ABSTRACT

A semiconductor package comprises an interposer and a photonics die. The photonics die has a front side with an on-chip fiber connector and solder bumps, the photonics die over the interposer with the on-chip fiber connector and the solder bumps facing away from the interposer. A patch substrate is mounted on the interposer adjacent to the photonics die. A logic die is mounted on the patch substrate with an overhang past an edge of the patch substrate and the overhang is attached to the solder bumps of the photonics die. An integrated heat spreader (IHS) is over the logic die such that the photonics die does not directly contact the IHS.

25 Claims, 6 Drawing Sheets

(56) References Cited

U.S. PATENT DOCUMENTS

| | | | |
|---|---|---|---|
| 11,664,319 B2* | 5/2023 | Ding | H01L 24/81 361/783 |
| 11,735,533 B2* | 8/2023 | Mallik | H01L 21/4853 257/668 |
| 2012/0025209 A1* | 2/2012 | Kim | G02B 6/4292 257/E33.077 |
| 2013/0270691 A1 | 10/2013 | Mallik | |
| 2013/0308898 A1 | 11/2013 | Christopher | |
| 2016/0183375 A1 | 6/2016 | Krithivasan et al. | |
| 2017/0108655 A1 | 4/2017 | Zarbock et al. | |
| 2017/0186739 A1* | 6/2017 | Budd | H01S 5/02469 |
| 2017/0287873 A1* | 10/2017 | Sankarasubramanian | H01L 24/17 |
| 2018/0040597 A1* | 2/2018 | Budd | H01S 5/11 |
| 2018/0299628 A1 | 10/2018 | Liu et al. | |
| 2019/0285804 A1 | 9/2019 | Ramachandran et al. | |
| 2019/0326266 A1 | 10/2019 | Traverso et al. | |
| 2020/0119828 A1* | 4/2020 | Sahni | G02B 6/4246 |
| 2020/0395313 A1* | 12/2020 | Mallik | H01L 23/562 |
| 2021/0405311 A1* | 12/2021 | Li | G02B 6/4292 |
| 2022/0093480 A1* | 3/2022 | Vepakomma | H01L 24/45 |
| 2022/0187548 A1* | 6/2022 | Marin | G02B 6/4213 |
| 2022/0187549 A1* | 6/2022 | Tanaka | G02B 6/428 |
| 2022/0190918 A1* | 6/2022 | Marin | H04B 10/2581 |
| 2022/0196935 A1* | 6/2022 | Li | G02B 6/4214 |
| 2022/0196940 A1* | 6/2022 | Karhade | G02B 6/3636 |
| 2022/0196943 A1* | 6/2022 | Li | G02B 6/4268 |
| 2022/0199486 A1* | 6/2022 | Mallik | H01S 5/02469 |
| 2022/0291462 A1* | 9/2022 | Pratap | G02B 6/4228 |
| 2022/0308293 A1* | 9/2022 | Li | G02B 6/4249 |
| 2022/0308294 A1* | 9/2022 | Morgan | G02B 6/4261 |
| 2022/0310566 A1* | 9/2022 | Li | H01L 33/58 |
| 2022/0319994 A1* | 10/2022 | Ding | G02B 6/428 |
| 2023/0081139 A1* | 3/2023 | Valavala | H01L 25/105 257/776 |
| 2023/0168448 A1* | 6/2023 | Li | G02B 6/423 385/49 |
| 2023/0299008 A1* | 9/2023 | Ding | H01L 23/5384 361/783 |
| 2024/0061195 A1* | 2/2024 | Chang | H01L 21/4857 |

OTHER PUBLICATIONS

Office Action from Netherlands Patent Application No. 2029788, mailed Apr. 4, 2023, 12 pgs.

Notice of Allowance from Netherlands Patent Application No. 2029788, mailed Jun. 21, 2023, 5 pgs.

Chandrasekhar Arun et al: "Server CPU Package Design Using PoINT Architecture", 2019 IEEE 69th Electronic Components and Technology Conference (ECTC), IEEE, 28 mei 2019 (May 28, 2019), bladzijden 2180-2185, XP033603932, DOI: 10.1109/ECTC. 2019.00-20 [gevonden op Aug. 22, 2019].

* cited by examiner

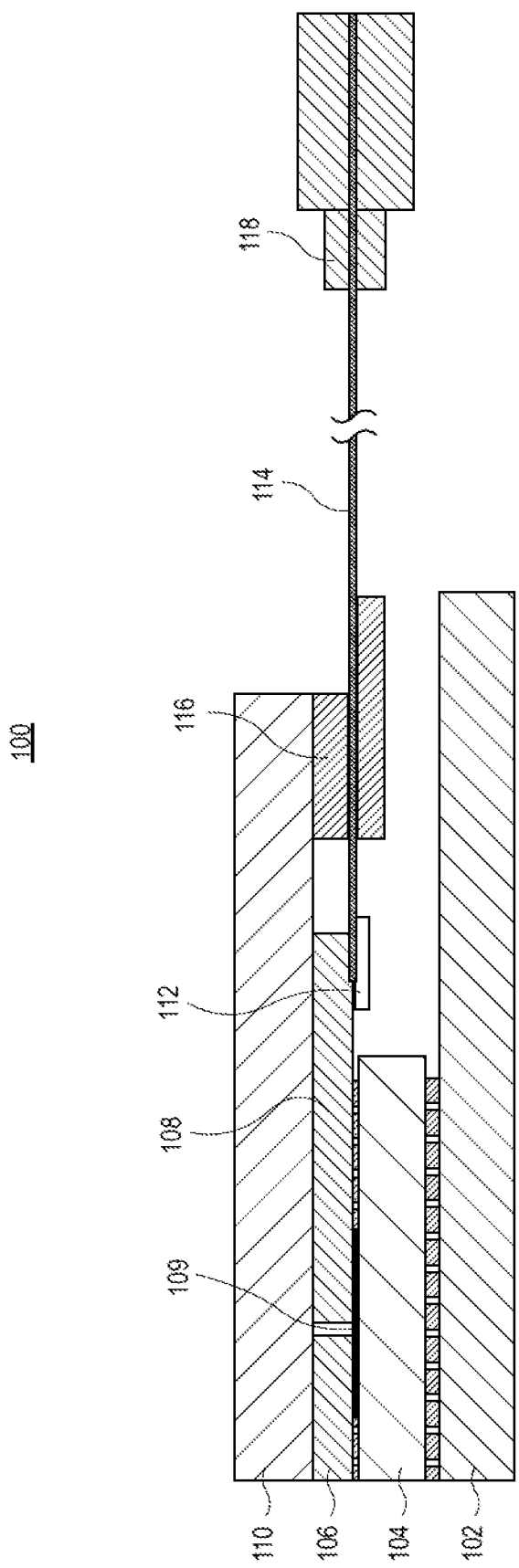

PATCH ON INTERPOSER ARCHITECTURE FOR LOW COST OPTICAL CO-PACKAGING

TECHNICAL FIELD

Embodiments of the disclosure are in the field of semiconductor packages and, in particular, a patch on interposer architecture for low cost optical co-packaging.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density.

For example, there is interest in architectures and process flows for low-cost and high volume manufacturing (HVM) compatible integration of a fiber connection with a flip chip package. In current architectures, an FPGA die or systems on a chip (SOC) and a photonics die are attached to a polymer substrate and connected through an embedded multi-die interconnect bridge (EMIB). The backside of the photonics die includes V-grooves that guide a fiber array into the photonics die. To make this connection, the photonics die is made partially overhanging an edge of the substrate so the V-groove can be accessed by fiber array in subsequent steps. Requiring the photonics die to overhang the edge of the substrate in the current architecture has assembly process challenges and may have reliability concerns.

Another option is to use an open cavity based assembly in which a groove or cavity is formed in the silicon substrate of the photonics die and partially under the FPGA die. The photonic die is flipped over and placed into the cavity so the fiber connections face upwards and the photonics die is connected directly to the FPGA die. However, formation of the silicon groove requires a minimum expected thickness of the silicon substrate to be greater than 200 um to avoid die cracking. Formation of such a deep open cavity can be an expensive process for HVM.

BRIEF DESCRIPTION OF THE DRAWINGS

FIG. 1 illustrates one embodiment for integrating a fiber connector in a flip chip semiconductor package.

DESCRIPTION OF THE EMBODIMENTS

Figure 2A:
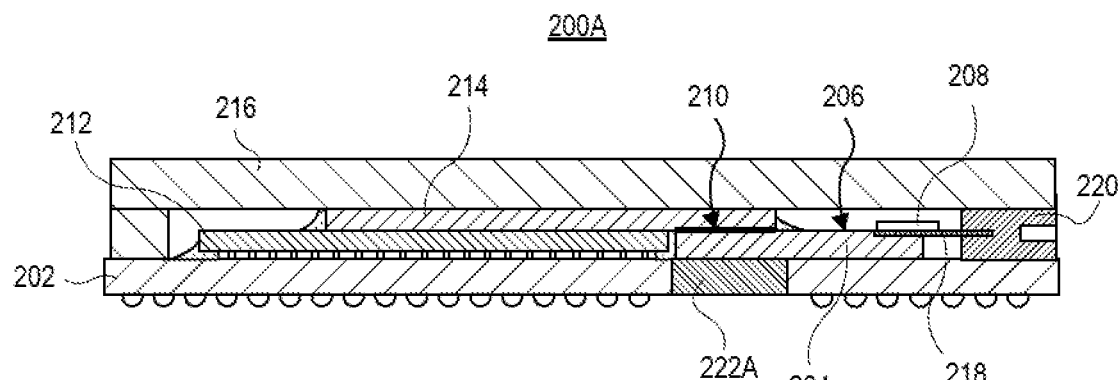
FIG. 2A illustrates a cross-section diagram of an optical semiconductor package with a patch on interposer architecture according to one embodiment.

A patch on interposer architecture for low cost optical co-packaging are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

There is increased need for techniques to integrate fiber connectors with a flip chip package. One or more embodiments described herein are directed to a patch on interposer architecture for low cost optical co-packaging with a logic die.

To provide context, FIG. 1 illustrates one embodiment for integrating a fiber connector in a flip chip semiconductor package. In this architecture, the semiconductor package 100 comprises a board 102 and a substrate 104 mounted to the board 102. A field-programmable gate array (FPGA) 106 (or systems on a chip (SOC)) and a photonics die 108 are attached to the substrate 104 and connected through an embedded multi-die interconnect bridge EMIB 109 in the substrate 104. An integrated heat spreader (IHS) 110 is attached to both the FPGA die 106 and the photonics die 108. The backside of the photonics die 108 includes a V-groove fiber connector 112 that guides a fiber array 114 into the photonics die 108. To make this connection, the photonics die 108 is attached to the substrate 104 so that the photonics die 108 partially overhangs an edge of the substrate 104 so the V-groove on the photonics die 108 can be accessed by fiber array 114 in subsequent steps. A connector support 116 is attached to and hangs from a portion of the IHS 110 that extends past the photonics die 108. The connector support 116 is attached in x, y, z, alignment with the V-groove fiber connector 112 to hold and support the fiber array 114 which passes there through. On the other side of the connector support 116, the fiber array 114 is attached to an external fiber connector (or MT ferrule) 118.

This architecture requires the photonics die 108 to overhang the edge of the substrate 104, which presents assembly process challenges and may have reliability concerns. In addition, the need for the EMIB 109 or the alternative open cavity bridge (OCB) based assembly in which a groove or cavity is formed in the substrate 104 partially under the FPGA die 106 to place the photonics die 108 backside up can dramatically increase fabrication cost.

In accordance with one or more embodiments described herein, a patch on interposer architecture is provided for low cost optical co-packaging. Instead of connecting the photonics die and a logic die using a substrate with an EMIB, the present embodiments split the substrate into two layers, an interposer and a patch substrate, and the photonics die is placed over an interposer with solder bumps facing up, and directly connected to the logic die without the need to etch a deep groove in a silicon package substrate. An integrated heat shield (IHS) is placed over the logic die and does not directly contact the photonics die. Since the photonics die does not directly contact the IHS, there are several cooling options for photonics die: 1) place a copper slug in substrate; 2) place a copper pillar array in substrate; and 3) attach dummy silicon between photonics die and the interposer, as explained below.

An optical semiconductor package fabricated using such an architecture eliminates die overhang from the embodiment of FIG. 1, and can also reduce cost by eliminating the need for EMIB and/or for OCB substrate processing. Applications of such systems may include, but are not limited to, an FPGA or system on a chip with an improved integrated fiber connection.

FIG. 2A illustrates a cross-section diagram of an optical semiconductor package with a patch on interposer architecture according to one embodiment. The optical semiconductor package 200A comprises an interposer 202 and a photonics die 204. The photonics die 204 has a front side 206 and an opposite backside, with the front side 206 having an on-chip fiber connector 208 adjacent to one end of the photonics die 204 and solder bumps 210 (shown in FIG. 2C) adjacent an opposite end. The photonics die 204 is over the interposer 202 front side 206 up, with the on-chip fiber connector 208 and the solder bumps 210 facing away from the interposer 202. This has the benefit of the on-chip fiber connector 208 being located on top of the photonics die 204 for greater accessibility. A patch substrate 212 is mounted on the interposer 202 adjacent to the photonics die 204. A logic die 214 is mounted on the patch substrate 212 with an overhang past an edge of the patch substrate 212, and the overhang is attached to the solder bumps 210 of the photonics die 204. In one embodiment, examples of the logic die 214 may include an FPGA and an SOC. An integrated heat spreader (IHS) 216 is over the logic die 214 such that the photonics die 204 does not directly contact the IHS 216. In one embodiment, the IHS 216 may optionally be glued to the interposer 202. In embodiments, both interposer 202 and the patch substrate 212 may comprise an organic substrate but other types of suitable substrates may be used.

In a further embodiment, the interposer 202 may include a copper slug 222A within a cavity in the interposer 202 beneath the photonics die 204 to extract heat away from the photonics die 204. In one embodiment, the copper slug 222A may have a footprint that is less than or equal to a footprint of the photonics die 204 so that the copper slug 222A extends beneath just a portion or all of the photonics die 204. If the copper slug 222A is the same size as a photonics die, then the copper slug 222A may be located directly beneath the photonics die 204. If the copper slug 222A is less than the size of the photonics die 204, then the copper slug 222A can be located anywhere beneath the photonics die 204.

Figure 2B:
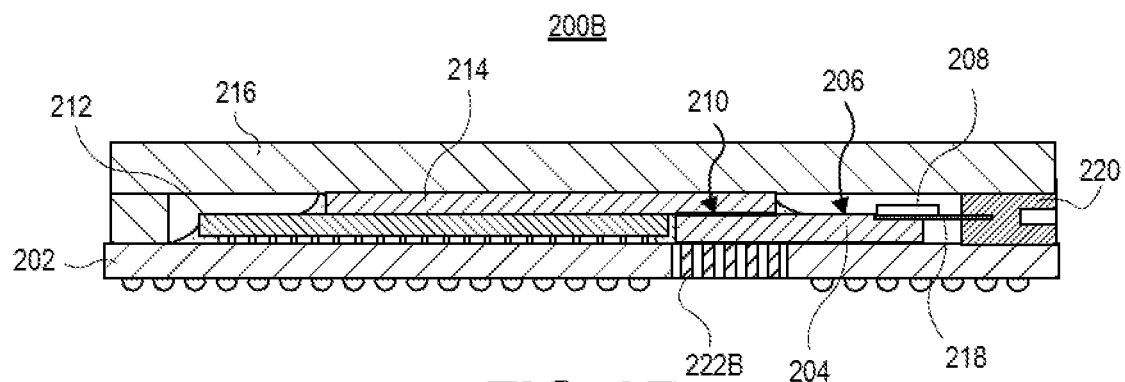
FIG. 2B illustrates a cross-section diagram of an optical semiconductor package with a patch on interposer architecture according to a second embodiment.

FIG. 2B illustrates a cross-section diagram of an optical semiconductor package 200B with a patch on interposer architecture according to a second embodiment, where like components from FIG. 2A have like reference numerals. In this embodiment, rather than use of a copper slug 222A, the interposer 202 may include a copper pillar array 222B located beneath the photonics die 204. In this embodiment, the copper pillar array 222B may have a footprint at least the size of the footprint of the photonics die 204.

Figure 2C:
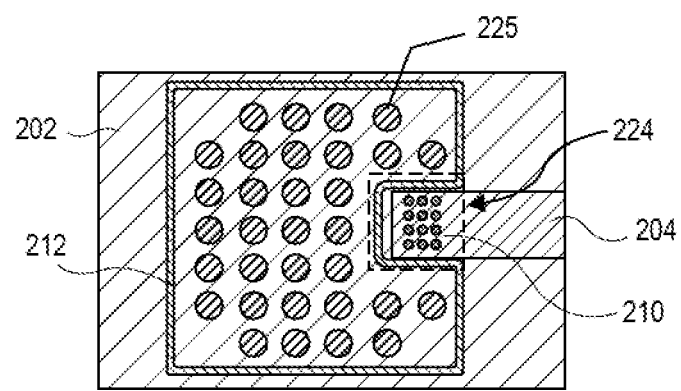
FIG. 2C illustrates a top view of the interposer, the patch substrate and the photonic die on the interposer.

FIG. 2C illustrates a top view of the interposer, the patch substrate and the photonic die on the interposer, where like components from FIGS. 2A and 2B have like reference numerals. This view shows that in the embodiments of FIGS. 2A and 2B, a body of the patch substrate 212 has a slot 224 therein. The patch substrate 212 is mounted to the interposer 202 such that the slot 224 surrounds the sides of one end of the photonics die 204. In this view, the upward facing solder bumps 210 of the photonics die 204 are also visible. In one embodiment, the logic die 214 (not shown) is mounted via solder bumps 225 to the patch substrate 212 such that the logic die 214 covers the slot 224 and the end of the logic die 214. The solder bumps 225 of the logic die 214 may also attach to the solder bumps 210 of the photonics die 204. In another embodiment, the body of the patch substrate 212 does not have a slot or cutout and the photonic die lies outside the patch substrate 212. The interposer 202 would then extend past the side of the patch substrate 212 and attach to photonic die 204. This embodiment will have the same cross section view as FIGS. 2A and 2B.

Figure 3:
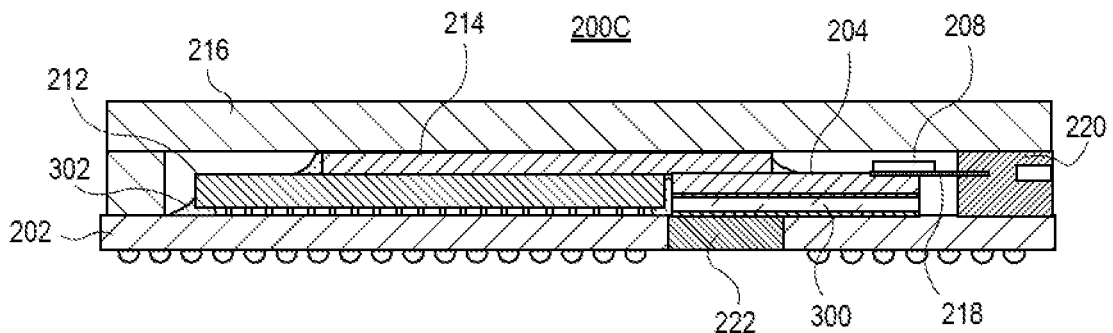
FIG. 3 illustrates a cross-section diagram of the optical semiconductor package with a patch on interposer architecture according to a third embodiment.

FIG. 3 illustrates a cross-section diagram of an optical semiconductor package 200C with a patch on interposer architecture according to a third embodiment, where like components from FIGS. 2A and 2B have like reference numerals. This embodiment covers the case where the patch substrate 212 has a thickness greater than the photonic die 204. In this case, a piece of dummy silicon 300 is mounted on the interposer 202 directly beneath the photonics die 204 to raise the height of the photonics die 204 above the interposer 202. In one embodiment, the dummy silicon 300 also acts as a further cooling option for the photonics die 204. In embodiments, the dummy silicon 300 may be the same size or slightly larger than the photonics die 204.

Figure 4:
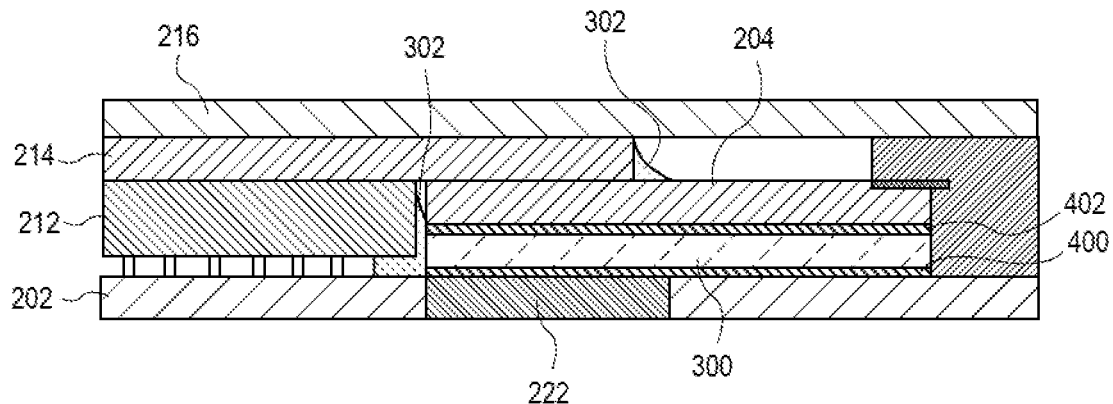
FIG. 4 illustrates a diagram showing an enlarged view of the dummy silicon and photonics die from FIG. 3.

FIG. 4 illustrates a diagram showing an enlarged view of the dummy silicon 300 and photonics die 204 from FIG. 3. In embodiments, the dummy silicon 300 may be attached to the interposer 202 with a first die attach (DAF) film 400, and may be attached to the photonics die 204 with a second die attach film 402. In both FIGS. 3 and 4, the copper slug 222A or the copper pillar array 222B (collectively shown as 222) is shown within a cavity in the interposer 202 beneath the dummy silicon 300 and the photonics die 204.

In some embodiments, as shown in FIGS. 3 and 4, an underfill epoxy material 302 may be deposited along bottom edges of the patch substrate 212 and the logic die 214.

Referring to FIG. 4, the underfill epoxy material 302 is shown between the dummy silicon 300 and the patch substrate 212.

In FIGS. 2A, 2B and 3, the on-chip fiber connector 208 is shown, which guides one end of a fiber array 114 into the photonics die 204, while the other end of the fiber array 218 is attached to an off-chip fiber connector 220. In the embodiment shown in FIGS. 2A, 2B and 3, the off-chip fiber connector 220 is spaced apart from the photonics die 204 and is mounted between the interposer 202 and IHS 216. In one embodiment, the on-chip fiber connector 208 may comprise a set of V-grooves.

Figure 5:
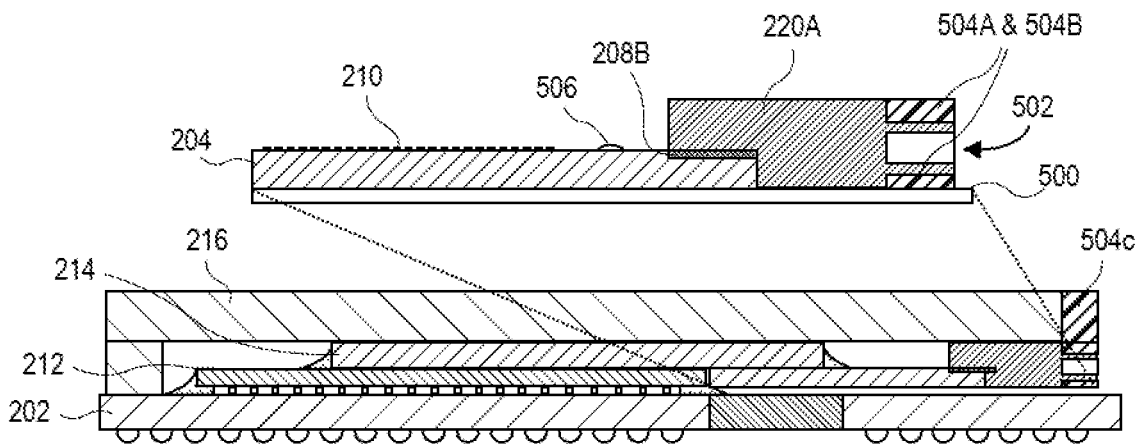
FIG. 5 illustrates a cross-section diagram of the optical semiconductor package with a patch on interposer architecture according to a fourth embodiment.

FIG. 5 illustrates a cross-section diagram of the optical semiconductor package with a patch on interposer architecture according to a fourth embodiment, where like components from FIGS. 2A-3 have like reference numerals. As shown in both FIGS. 4 and 5, in an alternative embodiment a fiber connector 220A is directly attached to the photonics die 204 over V-grooves 208B to connect a fiber array to an external fiber connector (not shown). Also in this embodiment, a panel carrier 500 is mounted on the interposer 202 adjacent to the patch substrate 212, and the photonics die 204 is attached to the panel carrier 500 with the solder bumps 210 facing up. The fiber connector 220A may be mounted on the panel carrier 500 as well between the panel carrier and the IHS 216.

In a further embodiment, the fiber connector 220A may include an alignment hole 502 to guide in an external fiber connector. One magnet 504A is placed on one side of the alignment hole and a second magnet 504B is placed on the other side of the alignment hole to aid insertion of the external fiber connector. In one embodiment, a third magnet 504C may be placed in the IHS 216 in alignment over the first and second magnets 504A and 504B to aid insertion of the fiber connector 220A. In some embodiments, an epoxy dam 506 may be on a top surface of the photonics die 204 between the V-grooves 208B and the solder bumps 210 to act a stop for the fiber connector 220A. In some embodiments, the epoxy dam 506 is replaced with a trench to avoid the epoxy from going from one side to the other.

Figure 6:
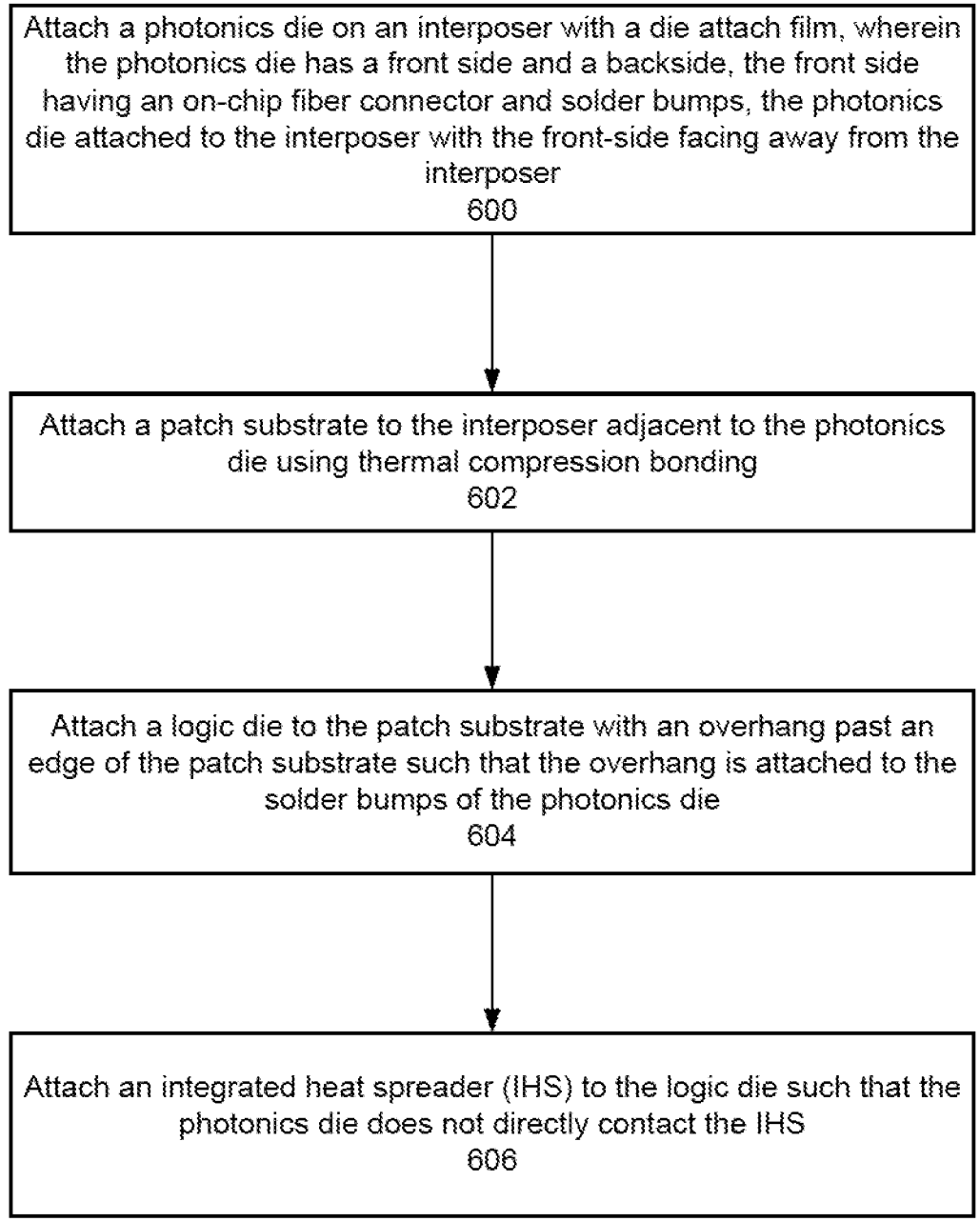
FIG. 6 illustrates a process for fabricating a semiconductor package having a patch on interposer architecture.

FIG. 6 illustrates a process for fabricating a semiconductor package having a patch on interposer architecture. The process may begin by attaching a photonics die on an interposer with a die attach film, wherein the photonics die has a front side and a backside, the front side having an on-chip fiber connector and solder bumps, the photonics die attached to the interposer with the front-side facing away from the interposer (block 600). During this process, an epoxy dam may be created between the V groove and the solder bumps on the photonics die followed by dispensing UV epoxy over the V-grooves. Instead of the epoxy dam, a trench may be formed on the photonics die in which to dispense the epoxy. It should be understood that the copper slug or pillars can be formed in the interposer either before or after the photonics die is attached to the interposer.

A patch substrate is attached to the interposer adjacent to the photonics die using thermal compression bonding (TCB) (block 602). The TCB process thermally compresses the solder balls of the patch substrate so that the patch substrate is mounted on the interposer at the same height as the photonics die. To achieve sufficient thickness variation or CTV, across the patch substrate and the photonics die for the logic die attach, the TCB nozzle may be designed to stop on the photonics die so that the patch substrate can be flush with the photonics die. In one embodiment, the patch substrate may be approximately 70-150 um in thickness.

The logic die is attached to the patch substrate with an overhang past an edge of the patch substrate such that the overhang is attached to the solder bumps of the photonics die (block 604). In one embodiment, the logic die attaches to the patch substrate using TCB with an epoxy underfill.

An integrated heat spreader (IHS) is attached to the logic die such that the photonics die does not directly contact the IHS (block 606). In one embodiment, the IHS can be designed to include a latching feature so the fiber connector can latch onto the IHS while guiding an external fiber connector into the on-chip fiber connector. In another embodiment, the IHS can include an embedded magnet to create a pull force for the fiber connector FAU plugging.

Figure 7:
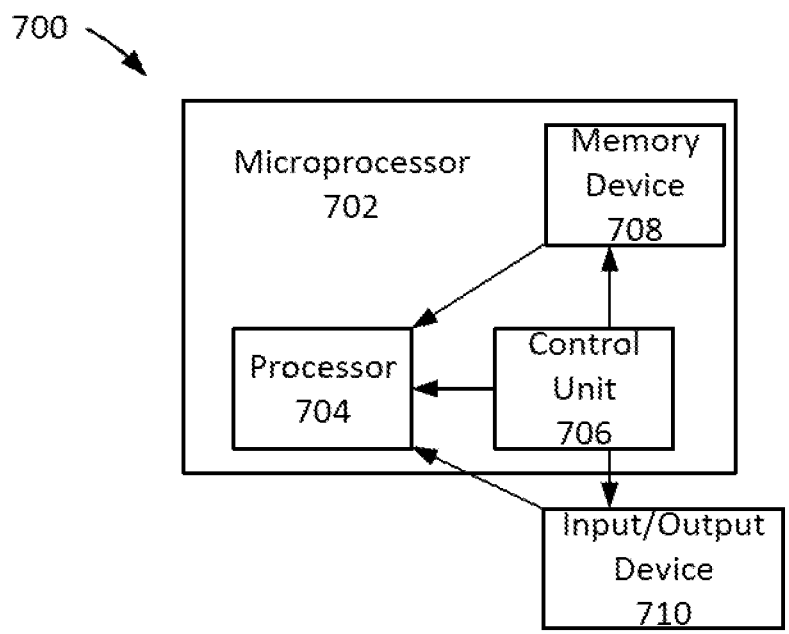
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more semiconductor packages having a patch on interposer architecture, such as those described herein.

Figure 8:
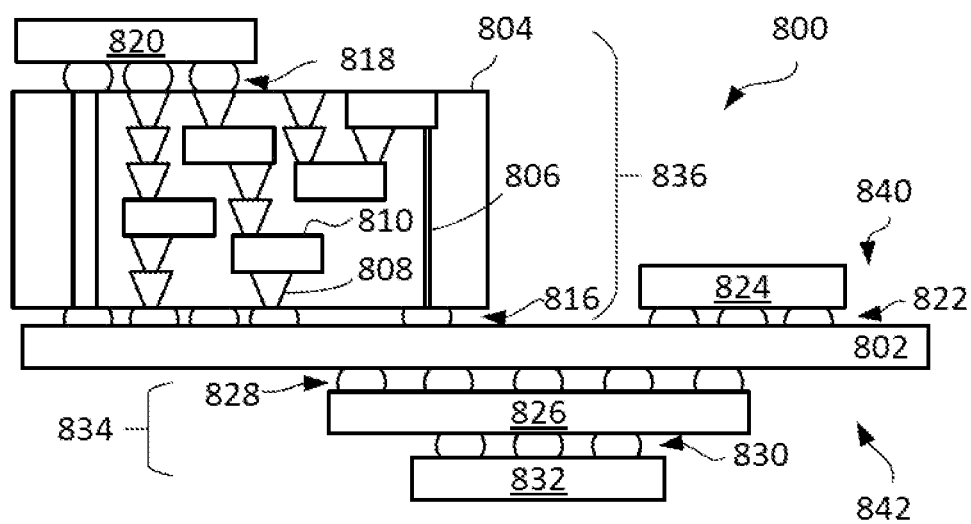
FIG. 8 is a cross-sectional side view of an integrated circuit (IC) device assembly that may include one or more semiconductor packages having a patch on interposer architecture, in accordance with one or more of the embodiments disclosed herein.

FIG. 8 is a cross-sectional side view of an integrated circuit (IC) device assembly that may include one or more semiconductor packages having a patch on interposer architecture, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of semiconductor packages having a patch on interposer architecture, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die, or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
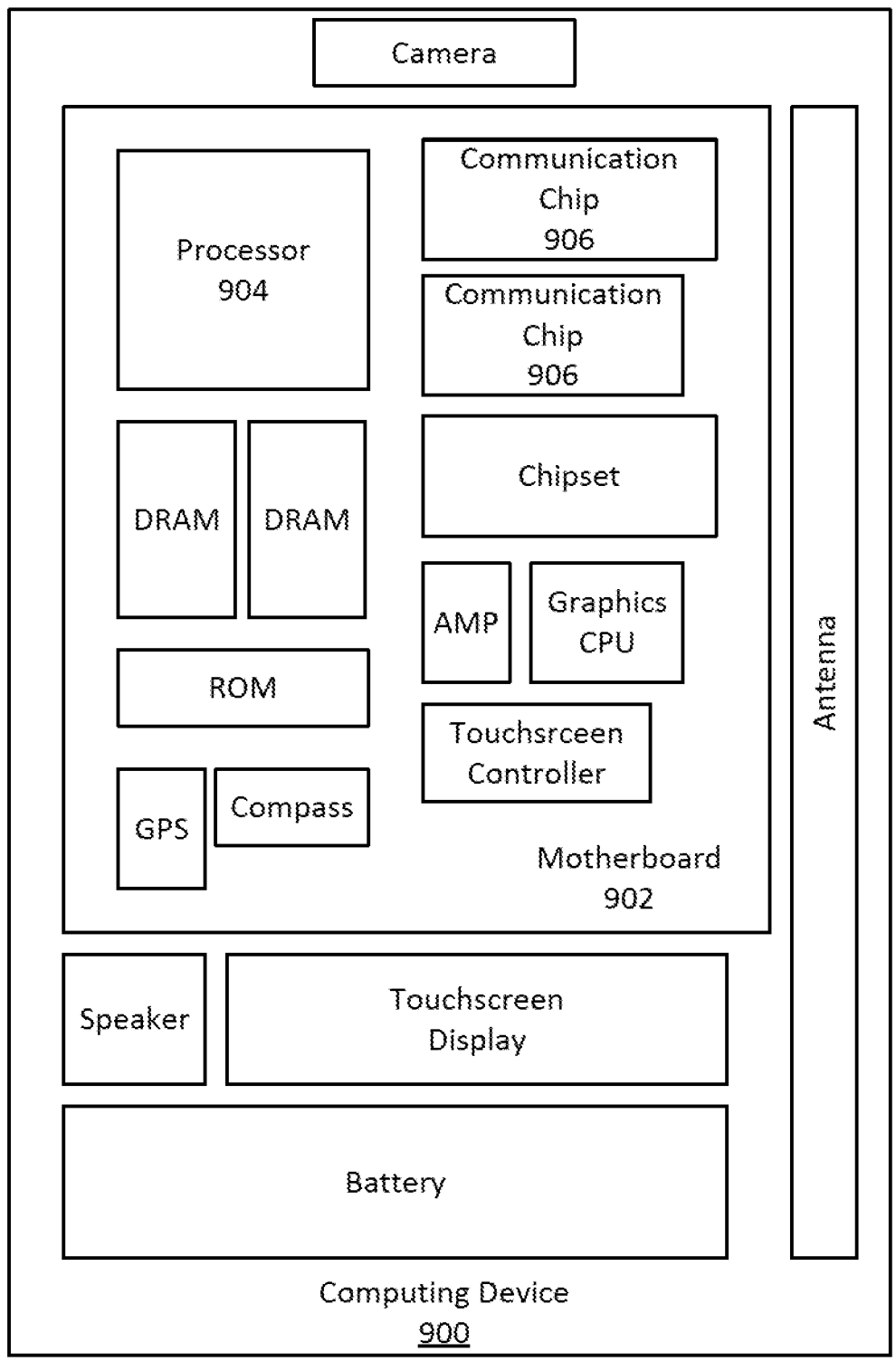
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more semiconductor packages having a patch on interposer architecture, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more semiconductor packages having a patch on interposer architecture, in accordance with implementations of embodiments of the disclosure.

In further implementations, another component housed within the computing device 900 may contain an integrated circuit die that includes one or more semiconductor packages having a patch on interposer architecture, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include semiconductor packages having a patch on interposer architecture.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A semiconductor package comprises an interposer and a photonics die. The photonics die has a front side with an on-chip fiber connector and solder bumps, the photonics die over the interposer with the on-chip fiber connector and the solder bumps facing away from the interposer. A patch substrate is mounted on the interposer adjacent to the photonics die. A logic die is mounted on the patch substrate with an overhang past an edge of the patch substrate and the overhang is attached to the solder bumps of the photonics die. An integrated heat spreader (IHS) is over the logic die such that the photonics die does not directly contact the IHS.

Example embodiment 2: The semiconductor package of embodiment 1, further comprising a copper slug within a cavity in the interposer beneath the photonics die to extract heat away from the photonics die.

Example embodiment 3: The semiconductor package of embodiment 1, further comprising a copper pillar array within a cavity in the interposer beneath the photonics die to extract heat away from the photonics die.

Example embodiment 4: The semiconductor package of embodiment 1, 2, or 3, wherein a body of the patch substrate has a slot therein, the patch substrate mounted to the interposer such that the slot surrounds one end of the photonics die.

Example embodiment 5: The semiconductor package of embodiment 4, wherein the logic die is mounted on the patch substrate and covers the slot so that a portion of the logic die is over the photonics die and is attached to the solder bumps of the photonics die.

Example embodiment 6: The semiconductor package of embodiment 1, 2, 3, 4, or 5, further comprising dummy silicon mounted on the interposer directly beneath the photonics die.

Example embodiment 7: The semiconductor package of embodiment 6, wherein the dummy silicon is attached to the interposer with a first die attach film, and is attached to the photonics die with a second die attach film.

Example embodiment 8: The semiconductor package of embodiment 6, further comprising at least one of a copper slug or a copper pillar array within a cavity in the interposer beneath dummy silicon.

Example embodiment 9: The semiconductor package of embodiment 1, 2, 3, 4, 5, 6, 7 or 8, further comprising one end of a fiber array attached to the on-chip fiber connector on the photonics die and a second end of the fiber array attached to a second fiber connector.

Example embodiment 10: The semiconductor package of embodiment 1, 2, 3, 4, 5, 6, 7, 8, or 9, wherein the second fiber connector is spaced apart from the photonics die and is mounted between the interposer and IHS.

Example embodiment 11: The semiconductor package of embodiment 1, 2, 3, 4, 5, 6, 7, 8, 9, or 10, wherein the fiber connector comprises a set of V-grooves on the photonics die to connect to a fiber array.

Example embodiment 12: The semiconductor package of embodiment 1, 2, 3, 4, 5, 6, 7, 8, or 9, wherein the on-chip fiber connector is directly attached to the photonics die over the set of V-grooves photonics die.

Example embodiment 13: The semiconductor package of embodiment 1, 2, 3, 4, 5, 6, 7, 8, 9, 10, 11, or 12, further comprising a panel carrier mounted on the interposer adjacent to the patch substrate, and the photonics die is attached to the panel carrier with the solder bumps facing up.

Example embodiment 14: The semiconductor package of embodiment 1, 2, 3, 4, 5, 6, 7, 8, 9, 10, 11, 12, or 13, wherein the fiber connector includes an alignment hole to guide in an external fiber connector, wherein a first magnet is placed on one side of the alignment hole and a second magnet is placed on a second side of the alignment hole.

Example embodiment 15: The semiconductor package of embodiment 13, further comprising a third magnet in the IHS in alignment over the first magnet and the second magnet.

Example embodiment 16: A semiconductor package comprises a photonics die mounted upside down on an interposer with a front side of the photonics die including a V-groove fiber connector and solder bumps facing away from the interposer. A patch substrate is mounted on the interposer adjacent to the photonics die. A field-programmable gate array (FPGA) die mounted on the patch substrate with an overhang past an edge of the patch substrate, and the overhang is attached to the solder bumps of the photonics die; and an integrated heat spreader (IHS) over the logic die such that the photonics die does not directly contact the IHS.

Example embodiment 17: The semiconductor package of embodiment 16, further comprising a copper slug within a cavity in the interposer beneath the photonics die to extract heat away from the photonics die.

Example embodiment 18: The semiconductor package of embodiment 16, further comprising a copper pillar array within a cavity in the interposer beneath the photonics die to extract heat away from the photonics die.

Example embodiment 19: The semiconductor package of embodiment 16, 17 or 18, wherein a body of the patch substrate has a slot therein, the patch substrate mounted to the interposer such that the slot surrounds one end of the photonics die.

Example embodiment 20: The semiconductor package of embodiment 19 wherein the FPGA die is mounted on the patch substrate and covers the slot so that a portion of the FPGA die is over the photonics die and is attached to the solder bumps of the photonics die.

Example embodiment 21: The semiconductor package of embodiment 16, 17, 18, 19 or 20, further comprising dummy silicon mounted on the interposer directly beneath the photonics die.

Example embodiment 22: The semiconductor package of embodiment 21, further comprising at least one of a copper slug or a copper pillar array within a cavity in the interposer beneath dummy silicon.

Example embodiment 23: The semiconductor package of embodiment 16, 17, 18, 19, 20, 21, or 22, further comprising one end of a fiber array attached to the V-groove connector on the photonics die and a second end of the fiber array attached to a second fiber connector.

Example embodiment 24: A method of fabricating a semiconductor package, the method comprises attaching a photonics die on an interposer with a die attach film, wherein the photonics die has a front side having an on-chip fiber connector and solder bumps, the photonics die attached to the interposer with the front-side facing away from the interposer. A patch substrate is attached to the interposer adjacent to the photonics die using thermal compression bonding. A logic dies is attached to the patch substrate with an overhang past an edge of the patch substrate such that the overhang is attached to the solder bumps of the photonics die. An integrated heat spreader (IHS) is attached to the logic die such that the photonics die does not directly contact the IHS.

Example embodiment 25: The method of embodiment 24, further comprising forming a copper slug or a copper pillar array in the interposer beneath the photonics die.

What is claimed is:

1. A semiconductor package, comprising:
   an interposer;
   a photonics die having a front-side with an on-chip fiber connector and solder bumps, the photonics die over the interposer with the front-side facing away from the interposer;
   a patch substrate mounted on the interposer adjacent to the photonics die;
   a logic die mounted on the patch substrate with an overhang past an edge of the patch substrate, and the overhang is attached to the solder bumps of the photonics die; and
   an integrated heat spreader (IHS) over the logic die such that the photonics die does not directly contact the IHS.

2. The semiconductor package of claim 1, further comprising a copper slug within a cavity in the interposer beneath the photonics die to extract heat away from the photonics die.

3. The semiconductor package of claim 1, further comprising a copper pillar array within a cavity in the interposer beneath the photonics die to extract heat away from the photonics die.

4. The semiconductor package of claim 1, wherein a body of the patch substrate has a slot therein, the patch substrate mounted to the interposer such that the slot surrounds one end of the photonics die.

5. The semiconductor package of claim 4, wherein the logic die is mounted on the patch substrate and covers the slot so that a portion of the logic die is over the photonics die and is attached to the solder bumps of the photonics die.

6. The semiconductor package of claim 1, further comprising dummy silicon mounted on the interposer directly beneath the photonics die.

7. The semiconductor package of claim 6, wherein the dummy silicon is attached to the interposer with a first die attach film, and is attached to the photonics die with a second die attach film.

8. The semiconductor package of claim 6, further comprising at least one of a copper slug or a copper pillar array within a cavity in the interposer beneath dummy silicon.

9. The semiconductor package of claim 1, further comprising one end of a fiber array attached to the on-chip fiber connector on the photonics die and a second end of the fiber array attached to a second fiber connector.

10. The semiconductor package of claim 9, wherein the second fiber connector is spaced apart from the photonics die and is mounted between the interposer and the IHS.

11. The semiconductor package of claim 9, wherein the fiber connector comprises a set of V-grooves on the photonics die to connect to a fiber array.

12. The semiconductor package of claim 9, wherein the on-chip fiber connector is directly attached to the photonics die over the set of V-grooves on the photonics die.

13. The semiconductor package of claim 1, further comprising a panel carrier mounted on the interposer adjacent to the patch substrate, and the photonics die is attached to the panel carrier with the solder bumps facing up.

14. The semiconductor package of claim 1, wherein the fiber connector includes an alignment hole to guide in an external fiber connector, wherein a first magnet is placed on one side of the alignment hole and a second magnet is placed on a second side of the alignment hole.

15. The semiconductor package of claim 14, further comprising a third magnet in the IHS in alignment over the first magnet and the second magnet.

16. A semiconductor package, comprising:
    a photonics die mounted upside down on an interposer with a front side of the photonics die including a V-groove fiber connector and solder bumps facing away from the interposer;
    a patch substrate mounted on the interposer adjacent to the photonics die;
    a field-programmable gate array (FPGA) die mounted on the patch substrate with an overhang past an edge of the patch substrate, and the overhang is attached to the solder bumps of the photonics die; and
    an integrated heat spreader (IHS) over the FPGA die such that the photonics die does not directly contact the IHS.

17. The semiconductor package of claim 16, further comprising a copper slug within a cavity in the interposer beneath the photonics die to extract heat away from the photonics die.

18. The semiconductor package of claim 16, further comprising a copper pillar array within a cavity in the interposer beneath the photonics die to extract heat away from the photonics die.

19. The semiconductor package of claim 16, wherein a body of the patch substrate has a slot therein, the patch substrate mounted to the interposer such that the slot surrounds one end of the photonics die.

20. The semiconductor package of claim 19, wherein the FPGA die is mounted on the patch substrate and covers the slot so that a portion of the FPGA die is over the photonics die and is attached to the solder bumps of the photonics die.

21. The semiconductor package of claim 16, further comprising dummy silicon mounted on the interposer directly beneath the photonics die.

22. The semiconductor package of claim 21, further comprising at least one of a copper slug or a copper pillar array within a cavity in the interposer beneath dummy silicon.

23. The semiconductor package of claim 16, further comprising one end of a fiber array attached to the V-groove connector on the photonics die and a second end of the fiber array attached to a second fiber connector.

24. A method of fabricating a semiconductor package, the method comprising:
   attaching a photonics die on an interposer with a die attach film, wherein the photonics die has a front-side having an on-chip fiber connector and solder bumps, the photonics die attached to the interposer with the front-side facing away from the interposer;
   attaching a patch substrate to the interposer adjacent to the photonics die using thermal compression bonding;
   attaching a logic die to the patch substrate with an overhang past an edge of the patch substrate such that the overhang is attached to the solder bumps of the photonics die; and
   attaching an integrated heat spreader (IHS) to the logic die such that the photonics die does not directly contact the IHS.

25. The method of claim 24, further comprising forming a copper slug or a copper pillar array in the interposer beneath the photonics die.

\* \* \* \* \*